(12) United States Patent
Chen

(10) Patent No.: US 6,548,192 B2
(45) Date of Patent: Apr. 15, 2003

(54) COATED ARTICLE HAVING THE APPEARANCE OF STAINLESS STEEL

(75) Inventor: Guocun Chen, Broomfield, CO (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

(21) Appl. No.: 09/827,006

(22) Filed: Apr. 5, 2001

(65) Prior Publication Data

US 2002/0146579 A1 Oct. 10, 2002

(51) Int. Cl.⁷ ............................................. B32B 15/04
(52) U.S. Cl. .................... 428/687; 428/621; 428/629; 428/632; 428/660; 428/675; 428/680; 428/687; 428/702; 428/469; 428/472; 428/622; 428/623; 428/627; 428/628; 428/633; 428/646; 428/648; 428/663; 428/666; 428/667; 428/668; 428/698; 428/699; 428/701; 428/704
(58) Field of Search ................. 428/472, 621, 428/629, 632, 660, 675, 680, 687, 702, 469, 622, 623, 627, 628, 633, 646, 648, 663, 666, 667, 668, 698, 699, 701, 704

(56) References Cited

U.S. PATENT DOCUMENTS

| | | |
|---|---|---|
| 5,413,874 A | 5/1995 | Moysan, III et al. |
| 5,476,724 A | 12/1995 | Moysan, III et al. |
| 5,478,659 A | 12/1995 | Moysan, III et al. |
| 5,478,660 A | 12/1995 | Moysan, III et al. |
| 5,482,788 A | 1/1996 | Moysan, III et al. |
| 5,484,663 A | 1/1996 | Moysan, III et al. |
| 5,552,233 A | 9/1996 | Moysan, III et al. |
| 5,626,972 A | 5/1997 | Moysan, III et al. |
| 5,639,564 A | 6/1997 | Moysan, III et al. |
| 5,641,579 A | 6/1997 | Moysan, III et al. |
| 5,648,179 A | 7/1997 | Moysan, III et al. |
| 5,654,108 A | 8/1997 | Moysan, III et al. |
| 5,667,904 A | 9/1997 | Moysan, III et al. |
| 5,783,313 A | 7/1998 | Moysan, III et al. |
| 5,814,415 A | 9/1998 | Moysan, III et al. |
| 5,879,532 A * | 3/1999 | Foster et al. ................. 205/192 |
| 5,922,478 A | 7/1999 | Welty et al. |
| 5,952,111 A | 9/1999 | Sugg et al. |
| 5,989,730 A | 11/1999 | Sugg et al. |
| 6,143,424 A | 11/2000 | Jonte et al. |
| 6,170,487 B1 * | 1/2001 | Ishiguro et al. .............. 128/897 |
| 6,196,936 B1 * | 3/2001 | Meckel ........................ 473/349 |

OTHER PUBLICATIONS

Application Ser. No. 09/746,476 filed Dec. 21, 2000.
Application Ser. No. 09/747,247 filed Dec. 21, 2000.
Application Ser. No. 09/827,193 filed Apr. 5, 2001.
Application Ser. No. 09/827,004 filed Apr. 5, 2001.
Application Ser. No. 09/827,005 filed Apr. 5, 2001.
Application Ser. No. 09/827,186 filed Apr. 5, 2001.
Application Ser. No. 09/827,187 filed Apr. 5, 2001.
Application Ser. No. 09/827,191 filed Apr. 5, 2001.
Application Ser. No. 09/827,189 filed Apr. 5, 2001.

* cited by examiner

Primary Examiner—Deborah Jones
Assistant Examiner—Andrew T Piziali
(74) Attorney, Agent, or Firm—Lloyd D. Doigan

(57) ABSTRACT

An article is coated with a multi-layer decorative and protective coating having the appearance of stainless steel. The coating comprises one or more electroplated layers on the surface of said article and vapor deposited on the electroplated layers a stack layer containing layers of refractory metal or metal alloy alternating with layers containing the reaction products of refractory metal or refractory metal alloy, nitrogen and oxygen wherein the total nitrogen and oxygen content of these reaction products is from about 4 to about 32 atomic percent with the nitrogen content being at least about 3 atomic percent.

15 Claims, 2 Drawing Sheets

COATED ARTICLE HAVING THE APPEARANCE OF STAINLESS STEEL

FIELD OF THE INVENTION

This invention relates to articles, particularly brass articles, coated with a multi-layered decorative and protective coating having the appearance or color of stainless steel.

BACKGROUND OF THE INVENTION

It is currently the practice with various brass articles such as faucets, faucet escutcheons, door knobs, door handles, door escutcheons and the like to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by acids. It would, therefore, be quite advantageous if brass articles, or indeed other articles, either plastic, ceramic, or metallic, could be provided with a coating which provided the article with a decorative appearance as well as providing wear resistance, abrasion resistance and corrosion resistance. It is known in the art that a multi-layered coating can be applied to an article which provides a decorative appearance as well as providing wear resistance, abrasion resistance and corrosion resistance. This multi-layer coating includes a decorative and protective color layer of a refractory metal nitride such as a zirconium nitride or a titanium nitride. This color layer, when it is zirconium nitride, provides a brass color, and when it is titanium nitride provides a gold color.

U.S. Pat. Nos. 5,922,478; 6,033,790 and 5,654,108, inter alia, describe a coating which provides an article with a decorative color, such as polished brass, and also provides wear resistance, abrasion resistance and corrosion resistance. It would be very advantageous if a coating could be provided which provided substantially the same properties as the coatings containing zirconium nitride or titanium nitride but instead of being brass colored or gold colored was stainless steel colored. The present invention provides such a coating.

SUMMARY OF THE INVENTION

The present invention is directed to an article such as a plastic, ceramic or metallic article having a decorative and protective multi-layer coating deposited on at least a portion of its surface. More particularly, it is directed to an article or substrate, particularly a metallic article such as aluminum, brass or zinc, having deposited on its surface multiple superposed layers of certain specific types of materials. The coating is decorative and also provides corrosion resistance, wear resistance and abrasion resistance. The coating provides the appearance of stainless steel, i.e. has a stainless steel color tone. Thus, an article surface having the coating thereon simulates a stainless steel surface.

The article first has deposited on its surface one or more electroplated layers. On top of the electroplated layers is then deposited, by vapor deposition such as physical vapor deposition, a sandwich or stack layer. A first layer deposited directly on the surface of the substrate is comprised of nickel. The first layer may be monolithic or it may consist of two different nickel layers such as, for example, a semi-bright nickel layer deposited directly on the surface of the substrate and a bright nickel layer superimposed over the semi-bright nickel layer. Over the electroplated layer(s) is a protective sandwich or stack layer comprised of layers containing a refractory metal or refractory metal alloy alternating with layers containing a refractory metal nitrogen and oxygen containing compound or a refractory metal alloy nitrogen and oxygen containing compound. Over the sandwich or stack layer is a color layer comprised of a refractory metal nitrogen and oxygen containing compound or a refractory metal alloy nitrogen and oxygen containing compound. The refractory metal nitrogen and oxygen containing compounds or refractory metal alloy nitrogen and oxygen containing compounds are the reaction products of a refractory metal or refractory metal alloy, oxygen and nitrogen, wherein the nitrogen and oxygen content is low, i.e., substoichiometric. The total nitrogen and oxygen content of these refractory metal nitrogen and oxygen containing compounds or refractory metal alloy nitrogen and oxygen containing compounds is from about 4 to about 32 atomic percent with the nitrogen content being at least about 3 atomic percent, preferably from about 5 to about 28 atomic percent with the nitrogen content being at least about 4 atomic percent.

DESCRIPTION OF THE PREFERRED EMBODIMENT

Figure 1:
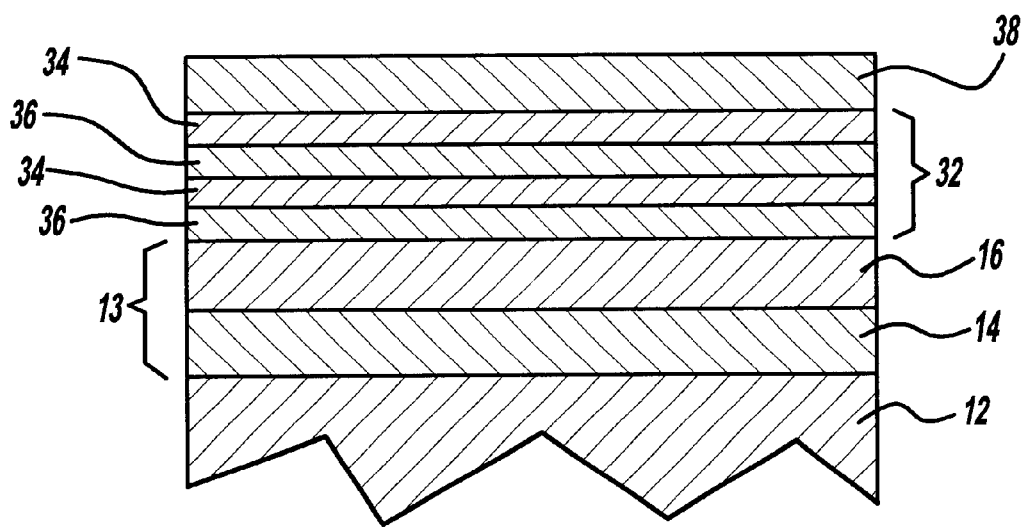
FIG. 1 is a cross sectional view, not to scale, of a portion of the substrate having a multi-layer coating comprising a duplex nickel base coat layer, a protective stack or sandwich layer on the top nickel layer, and a color layer on the stack layer.

The article or substrate 12 can be comprised of any material onto which a plated layer can be applied, such as plastic, e.g., ABS, polyolefin, polyvinylchloride, and phenolformaldehyde, ceramic, metal or metal alloy. In one embodiment it is comprised of a metal or metallic alloy such as copper, steel, brass, zinc, aluminum, nickel alloys and the like.

In the instant invention, as illustrated in FIGS. 1—4, a first layer or series of layers is applied onto the surface of the article by plating such as electroplating. A second layer or series of layers is applied onto the surface of the electroplated layer or layers by vapor deposition. The electroplated layers serve, inter alia, as a base coat which levels the surface of the article. In one embodiment of the instant invention a nickel layer 13 may be deposited on the surface of the article. The nickel layer may be any of the conventional nickels that are deposited by plating, e.g., bright nickel, semi-bright nickel, satin nickel, etc. The nickel layer 13 may be deposited on at least a portion of the surface of the substrate 12 by conventional and well-known electroplating processes. These processes include using a conventional electroplating bath such as, for example, a Watts bath as the plating solution. Typically such baths contain nickel sulfate, nickel chloride, and boric acid dissolved in water. All chloride, sulfamate and fluoroborate plating solutions can also be used. These baths can optionally include a number of well known and conventionally used compounds such as leveling agents, brighteners, and the like. To produce specularly bright nickel layer at least one brightener from class I and at least one brightener from class II is added to the plating solution. Class I brighteners are organic compounds which contain sulfur. Class II brighteners are organic compounds which do not contain sulfur. Class II brighteners can also cause leveling and, when added to the plating bath without the sulfur-containing class I brighteners, result in semi-bright nickel deposits. These class I brighteners include alkyl naphthalene and benzene sulfonic acids, the benzene and naphthalene di- and trisulfonic acids, benzene and naphthalene sulfonamides, and sulfonamides such as saccharin, vinyl and allyl sulfonamides and sulfonic acids. The class II brighteners generally are unsaturated organic materials such as, for example, acetylenic or ethylenic alcohols, ethoxylated and propoxylated acetylenic alcohols, coumarins, and aldehydes. These class I and class II brighteners are well known to those skilled in the art and are readily commercially available. They are described, inter alia, in U.S. Pat. No. 4,421,611 incorporated herein by reference.

The nickel layer can be comprised of a monolithic layer such as semi-bright nickel, satin nickel or bright nickel, or it can be a duplex layer containing two different nickel layers, for example, a layer comprised of semi-bright nickel and a layer comprised of bright nickel. The thickness of the nickel layer is generally a thickness effective to level the surface of the article and to provide improved corrosion resistance. This thickness is generally in the range of from about 2.5 $\mu$m, preferably about 4 $\mu$m to about 90 $\mu$m.

As is well known in the art before the nickel layer is deposited on the substrate the substrate is subjected to acid activation by being placed in a conventional and well known acid bath.

In one embodiment as illustrated in FIGS. 1–4, the nickel layer 13 is actually comprised of two different nickel layers 14 and 16. Layer 14 is comprised of semi-bright nickel while layer 16 is comprised of bright nickel. This duplex nickel deposit provides improved corrosion protection to the underlying substrate. The semi-bright, sulfur-free plate 14 is deposited by conventional electroplating processes directly on the surface of substrate 12. The substrate 12 containing the semi-bright nickel layer 14 is then placed in a bright nickel plating bath and the bright nickel layer 16 is deposited on the semi-bright nickel layer 14.

The thickness of the semi-bright nickel layer and the bright nickel layer is a thickness at least effective to provide improved corrosion protection and/or leveling of the article surface. Generally, the thickness of the semi-bright nickel layer is at least about 1.25 $\mu$m, preferably at least about 2.5 $\mu$m, and more preferably at least about 3.5 $\mu$m. The upper thickness limit is generally not critical and is governed by secondary considerations such as cost. Generally, however, a thickness of about 40 $\mu$m, preferably about 25 $\mu$m, and more preferably about 20 $\mu$m should not be exceeded. The bright nickel layer 16 generally has a thickness of at least about 1.2 $\mu$m, preferably at least about 3 $\mu$m, and more preferably at least about 6 $\mu$m. The upper thickness range of the bright nickel layer is not critical and is generally controlled by considerations such as cost. Generally, however, a thickness of about 60 $\mu$m, preferably about 50 $\mu$m, and more preferably about 40 $\mu$m should not be exceeded. The bright nickel layer 16 also functions as a leveling layer which tends to cover or fill in imperfections in the substrate.

Figure 3:
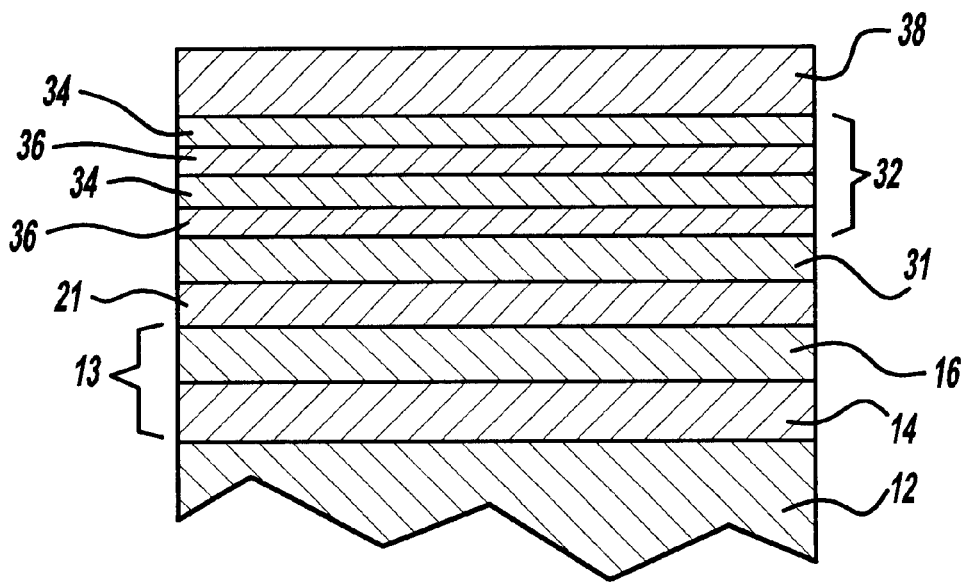
FIG. 3 is a view similar to FIG. 2 except that a chromium layer is present intermediate the top nickel layer and the refractory metal strike layer.
Figure 4:
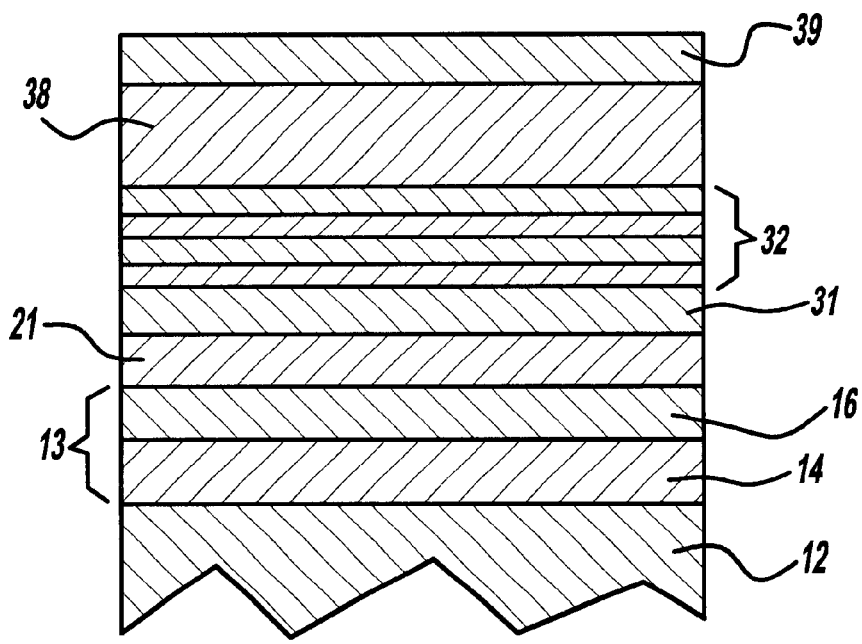
FIG. 4 is a view similar to FIG. 3 except that a refractory metal oxide or a refractory metal alloy oxide layer is present on the color layer.

In one embodiment, as illustrated in FIGS. 3 and 4, disposed between the nickel layer 13 and the vapor deposited layer(s) are one or more additional electroplated layers 21. These additional electroplated layers include but are not limited to chromium, tin-nickel alloy, and the like. When layer 21 is comprised of chromium it may be deposited on the nickel layer 13 by conventional and well known chromium electroplating techniques. These techniques along with various chrome plating baths are disclosed in Brassard, "Decorative Electroplating—A Process in Transition", Metal Finishing, pp. 105–108, June 1988; Zaki, "Chromium Plating", PF Directory, pp. 146–160; and in U.S. Pat. Nos. 4,460,438; 4,234,396; and 4,093,522, all of which are incorporated herein by reference.

Chrome plating baths are well known and commercially available. A typical chrome plating bath contains chromic acid or salts thereof, and catalyst ion such as sulfate or fluoride. The catalyst ions can be provided by sulfuric acid or its salts and fluosilicic acid. The baths may be operated at a temperature of about 112°–116° F. Typically in chrome plating a current density of about 150 amps per square foot, at about 5 to 9 volts is utilized.

The chrome layer generally has a thickness of at least about 0.05 $\mu$m, preferably at least about 0.12 $\mu$m, and more preferably at least about 0.2 $\mu$m. Generally, the upper range of thickness is not critical and is determined by secondary considerations such as cost. However, the thickness of the chrome layer should generally not exceed about 1.5 $\mu$m, preferably about 1.2 $\mu$m, and more preferably about 1 $\mu$m.

Instead of layer 21 being comprised of chromium it may be comprised of tin-nickel alloy, that is an alloy of nickel and tin. The tin-nickel alloy layer may be deposited on the surface of the substrate by conventional and well known tin-nickel electroplating processes. These processes and plating baths are conventional and well known and are disclosed, inter alia, in U.S. Pat. Nos. 4,033,835; 4,049,508; 3,887,444; 3,772,168 and 3,940,319, all of which are incorporated herein by reference.

The tin-nickel alloy layer is preferably comprised of about 60–70 weight percent tin and about 30–40 weight percent nickel, more preferably about 65% tin and 35% nickel representing the atomic composition SnNi. The plating bath contains sufficient amounts of nickel and tin to provide a tin-nickel alloy of the afore-described composition.

A commercially available tin-nickel plating process is the NiColloy™ process available from ATOTECH, and described in their Technical Information Sheet No: NiColloy, Oct. 30, 1994, incorporated herein by reference.

The thickness of the tin-nickel alloy layer 21 is generally at least about 0.25 $\mu$m, preferably at least about 0.5 $\mu$m, and more preferably at least about 1.2 $\mu$m. The upper thickness range is not critical and is generally dependent on economic considerations. Generally, a thickness of about 50 $\mu$m, preferably about 25 $\mu$m, and more preferably about 15 $\mu$m should not be exceeded.

Over the electroplated layers is deposited, by vapor deposition such as physical vapor deposition and chemical vapor deposition, preferably physical vapor deposition, at least a sandwich or stack layer 32 comprised of layers 34 comprising a refractory metal or a refractory metal alloy alternating with layers 36 comprised of a refractory metal nitrogen and oxygen containing compound or a refractory metal alloy nitrogen and oxygen containing compound.

The refractory metals and refractory metal alloys comprising layers 34 include hafnium, tantalum, titanium, zirconium, zirconium-titanium alloy, zirconium-hafnium alloy, and the like, preferably hafnium, titanium, zirconium or zirconium-titanium alloy.

The refractory metal nitrogen and oxygen containing compounds and refractory metal alloy nitrogen and oxygen containing compounds comprising layers 36 are the reaction products of a refractory metal or refractory metal alloy, oxygen and nitrogen. In these refractory metal nitrogen and oxygen containing compounds and refractory metal alloy nitrogen and oxygen containing compounds the total nitrogen and oxygen content is from about 4 to about 32 atomic percent, preferably from about 5 to about 28 atomic percent. Thus, for example, the nitrogen content is 6 atomic percent and the oxygen content is 20 atomic percent, the nitrogen content is 8 atomic percent and the oxygen content is 8 atomic percent, the nitrogen content is 15 atomic percent and the oxygen content is 2 atomic percent. Oxygen is generally present in these reaction products in an amount of at least about 1 atomic percent.

The nitrogen content of these reaction products generally contributes, inter alia, to the coating having its stainless steel color. The nitrogen content is from at least about 3 atomic percent to about 22 atomic percent, preferably from at least about 4 atomic percent to about 16 atomic percent. The nitrogen content should not exceed about 22 atomic percent, preferably about 16 atomic percent, or the coating loses its stainless steel appearance and begins to have a nickel color. Thus, the nitrogen content is critical to the coating having a stainless steel color.

The reaction products of the refractory metal or refractory metal alloy, oxygen and nitrogen are generally comprised of the refractory metal oxide or refractory metal alloy oxide, refractory metal nitride or refractory metal alloy nitride, and refractory metal oxy-nitride or refractory metal alloy oxy-nitride. Thus, for example, the reaction products of zirconium, oxygen and nitrogen comprise zirconium oxide, zirconium nitride and zirconium oxy-nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

The sandwich or stack layer 32 generally has an average thickness of from about 500 Å to about 1 μm, preferably from about 0.1 μm to about 0.9 μm, and more preferably from about 0.15 μm to about 0.75 m. The sandwich or stack layer generally contains from about 4 to about 100 alternating layers 34 and 36, preferably from about 8 to about 50 alternating layers 34 and 36.

Each of layers 34 and 36 generally has a thickness of at least about 15 Å, preferably at least about 30 Å, and more preferably at least about 75 Å. Generally, layers 34 and 36 should not be thicker than about 0.38 μm, preferably about 0.25 μm, and more preferably about 0.1 μm.

A method of forming the stack layer 32 is by utilizing sputtering or cathodic arc evaporation to deposit a layer 34 of refractory metal such as zirconium or titanium followed by reactive sputtering or reactive cathodic arc evaporation to deposit a layer 36 of refractory metal nitrogen and oxygen containing compound or metal alloy nitrogen and oxygen containing compound.

Preferably the flow rate of nitrogen gas and oxygen is varied (pulsed) during vapor deposition, such as reactive sputtering, between zero (no gas is introduced) to the introduction of gas at a desired value to form multiple alternating layers of refractory metal or refractory metal alloy 36 and reaction products of refractory metal or refractory metal alloy, nitrogen and oxygen 34 in the sandwich layer 32.

Over sandwich or stack layer 32 is a color layer 38. The color layer 38 is comprised of the reaction products of a refractory metal or a refractory metal alloy, nitrogen and oxygen wherein the total oxygen and nitrogen content of said reaction products is from about 5 to about 32 atomic percent with the nitrogen content being at least about 4 atomic percent, preferably from about 6 to about 28 atomic percent with the nitrogen content being at least about 5 atomic percent. Color layer 38 is comprised of the same nitrogen and oxygen containing compounds as layers 36. Color layer 38 has a thickness at least effective to provide color, more specifically a stainless steel color. Generally, this thickness is at least about 25 Å, and more preferably at least about 500 Å. The upper thickness range is generally not critical and is dependent upon secondary considerations such as cost. Generally a thickness of about 0.75 μm, preferably about 0.65 μm, and more preferably about 0.5 μm should not be exceeded.

Varying the amount of oxygen content in the color layer 38 will make the stainless steel color more bluish or yellowish. Increasing the oxygen content will make the color layer have a bluish tint. Lowering the oxygen content will make the color layer have a yellowish tint.

Figure 2:
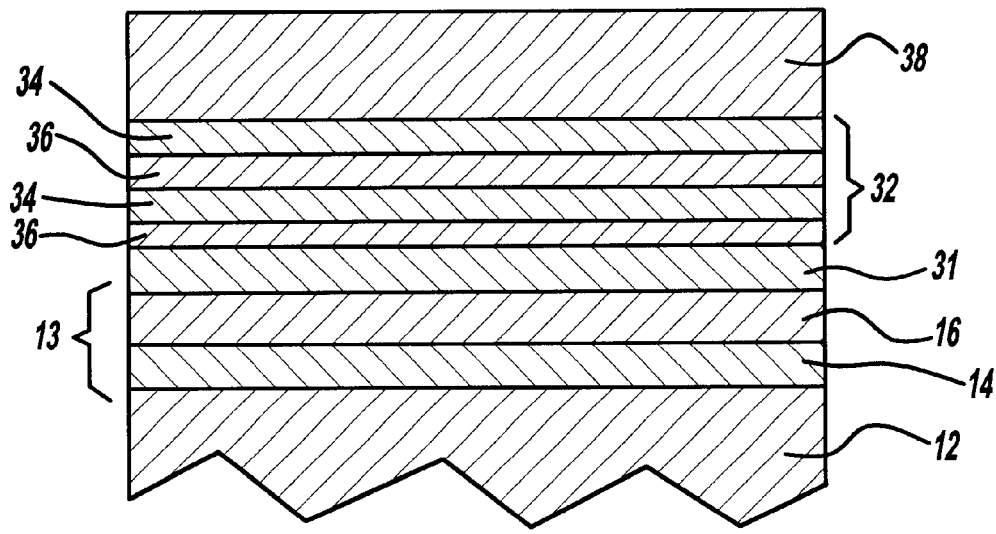
FIG. 2 is a view similar to FIG. 1 except that a refractory metal or refractory metal alloy strike layer is present intermediate the top nickel layer and the stack layer.

In addition to the sandwich or stack layer 32 and the color layer 38 there may optionally be present additional vapor deposited layers. These additional vapor deposited layers may include a layer comprised of refractory metal or refractory metal alloy deposited between the stack layer 32 and the electroplated layers. The refractory metals include hafnium, tantalum, zirconium and titanium. The refractory metal alloys include zirconium-titanium alloy, zirconium-hafnium alloy and titanium-hafnium alloy. The refractory metal layer or refractory metal alloy layer 31 generally functions, inter alia, as a strike layer which improves the adhesion of the sandwich layer 32 to the electroplated layers. As illustrated in FIGS. 2–4, the refractory metal or refractory metal alloy strike layer 31 is generally disposed intermediate the stack layer 32 and the electroplated layers. Layer 31 has a thickness which is generally at least effective for layer 31 to function as a strike layer, i.e., to improve the adhesion of the stack layer 32 to the underlying electroplated layer. Generally, this thickness is at least about 60 Å, preferably at least about 120 Å, and more preferably at least about 250 Å. The upper thickness range is not critical and is generally dependent upon considerations such as cost. Generally, however, layer 31 should not be thicker than about 1.2 μm, preferably about 0.5 μm, and more preferably about 0.25 μm.

The refractory metal or refractory metal alloy layer 31 is deposited by conventional and well known vapor deposition techniques including physical vapor deposition techniques such as cathodic arc evaporation (CAE) or sputtering. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In a preferred embodiment of the present invention the refractory metal is comprised of titanium, hafnium or zirconium, and the refractory metal alloy is comprised of zirconium-titanium alloy.

The additional vapor deposited layers may also include refractory metal compounds and refractory metal alloy compounds other than the above described reaction products of refractory metal or refractory metal alloy, oxygen and nitrogen. These refractory metal compounds and refractory metal alloy compounds include the refractory metal oxides and refractory metal alloy oxides, the refractory metal carbides and refractory metal alloy carbides, the refractory metal nitrides and refractory metal alloy nitrides, and the refractory metal carbonitrides and refractory metal alloy carbonitrides.

In one embodiment of the invention, as illustrated in FIG. 4, a layer 39 comprised of refractory metal oxide or refractory metal alloy oxide is disposed over color layer 38. The refractory metal oxides and refractory metal alloy oxides of which layer 39 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide. These oxides and their preparation are conventional and well known.

Layer 39 is effective in providing improved chemical, such as acid or base, resistance to the coating. Layer 39 containing refractory metal oxide or refractory metal alloy oxide generally has a thickness at least effective to provide improved chemical resistance. Generally this thickness is at least about 10 Å, preferably at least about 25 Å, and more preferably at least about 40 Å. Layer 39 should be thin enough so that it does not obscure the color of underlying color layer 38. That is to say layer 39 should be thin enough so that it is non-opaque or substantially transparent. Generally layer 39 should not be thicker than about 0.10 $\mu$m, preferably about 250 Å, and more preferably about 100 Å.

The stainless steel color of the coating can be controlled or predetermined by designated stainless steel color standard. In the case where color layer 38 is comprised of the reaction products of a refractory metal or refractory metal alloy, nitrogen and oxygen the stainless steel color may be adjusted to be slightly more yellowish or bluish by an increase or decrease in nitrogen to oxygen ratio in total gas flow. Polished or brushed surface finish of stainless steels may be exactly matched.

In order that the invention may be more readily understood, the following example is provided. The example is illustrative and does not limit the invention thereto.

EXAMPLE 1

Brass faucets are placed in a conventional soak cleaner bath containing the standard and well known soaps, detergents, deflocculants and the like which is maintained at a pH of 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, deflocculants and the like. After the ultrasonic cleaning the faucets are rinsed and placed in a conventional alkaline electro cleaner bath. The electro cleaner bath is maintained at a temperature of about 140–180° F., a pH of about 10.5–11.5, and contains standard and conventional detergents. The faucets are then rinsed twice and placed in a conventional acid activator bath. The acid activator bath has a pH of about 2.0–3.0, is at an ambient temperature, and contains a sodium fluoride based acid salt. The faucets are then rinsed twice and placed in a bright nickel plating bath for about 12 minutes. The bright nickel bath is generally a conventional bath which is maintained at a temperature of about 130–150° F., a pH of about 4.0, contains $NiSO_4$, $NiCl_2$, boric acid, and brighteners. A bright nickel layer of an average thickness of about 10 $\mu$m is deposited on the faucet surface. The bright nickel plated faucets are rinsed three times and then placed in a conventional, commercially available hexavalent chromium plating bath using conventional chromium plating equipment for about seven minutes. The hexavalent chromium bath is a conventional and well known bath which contains about 32 ounces/gallon of chromic acid. The bath also contains the conventional and well known chromium plating additives. The bath is maintained at a temperature of about 112–116° F., and utilizes a mixed sulfate/fluoride catalyst. The chromic acid to sulfate ratio is about 200:1. A chromium layer of about 0.25 $\mu$m is deposited on the surface of the bright nickel layer. The faucets are thoroughly rinsed in deionized water and then dried. The chromium plated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, sources of nitrogen and oxygen gases are connected to the chamber by adjustable valves for varying the rates of flows of nitrogen and oxygen into the chamber.

A cylindrical cathode is mounted in the center of the chamber and connected to negative outputs of a variable D.C. power supply. The positive side of the power supply is connected to the chamber wall. The cathode material comprises zirconium.

The plated faucets are mounted on spindles, 16 of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 150° C.

The electroplated faucets are then subjected to a high-bias arc plasma cleaning in which a (negative) bias voltage of about 500 volts is applied to the electroplated faucets while an arc of approximately 500 amperes is struck and sustained on the cathode. The duration of the cleaning is approximately five minutes.

Argon gas is introduced at a rate sufficient to maintain a pressure of about 1 to 5 millitorr. A layer of zirconium having an average thickness of about 0.1 $\mu$m is deposited on the chrome plated faucets during a three minute period. The cathodic arc deposition process comprises applying D.C. power to the cathode to achieve a current flow of about 500 amps, introducing argon gas into the vessel to maintain the pressure in the vessel at about 1 to 5 millitorr and rotating the faucets in a planetary fashion described above.

After the zirconium layer is deposited a protective stack layer is applied onto the zirconium strike layer. A flow of nitrogen and oxygen is introduced into the vacuum chamber periodically at a flow rate sufficient to provide a total nitrogen and oxygen content of about 5 to about 28 atomic percent each. This flow of oxygen and nitrogen is about 4 to 30% of total flow of argon, nitrogen and oxygen. The arc discharge continues at approximately 500 amperes during the flow. The nitrogen and oxygen flow rate is pulsed, that is to say, it is changed periodically from about 10% to 20% of total flow and a flow rate of about zero. The period for the nitrogen and oxygen pulsing is one to two minutes (30 seconds to one minute on, then off). The total time for pulsed deposition is about 15 minutes resulting in a stack of about 10 to 15 layers of a thickness of about one to about 2.5 Å to about 75 Å for each layer.

After the stack layer is deposited, the nitrogen and oxygen flow rate is left on at a flow rate sufficient to provide a total nitrogen and oxygen content of about 6 to 28 atomic percent each. This oxygen and nitrogen flow rate is about 4 to about 20% of total flow of argon, nitrogen and oxygen. This flow is continued for a period of time of about 5 to 10 minutes to form the color layer on top of the stack layer. After this color layer is deposited, the flow of nitrogen is terminated and a flow of oxygen of approximately 0.1 standard liters per minute is continued for a time of thirty seconds to one minute. A thin layer of zirconium oxide with thickness of approximately 50 Å–125 Å is formed. The arc is extinguished at the end of this last deposition period, the vacuum chamber is vented and the coated substrates removed.

While certain embodiments of the invention have been described for purposes of illustration, it is to be understood that there may be various embodiments and modifications within the general scope of the invention.

I claim:

1. An article having on at least a portion of its surface a protective and decorative coating having the appearance of stainless steel said coating comprising:
   at least one layer comprised of nickel and
   a stack layer comprised of layers of refractory metal or refractory metal alloy alternating with layers comprised of reaction products of refractory metal or refractory metal alloy, nitrogen and oxygen; and
   a layer having the appearance of stainless steel comprised of reaction products of refractory metal or refractory metal alloy, nitrogen and oxygen wherein the total nitrogen and oxygen content of said reaction products is from about 4 to about 32 atomic percent with the nitrogen content being a substoichiometric amount of at least about 3 atomic percent.

2. The article of claim 1 wherein said nitrogen and oxygen content are from about 5 to about 28 atomic percent with the nitrogen content being at least about 4 atomic percent.

3. The article of claim 1 wherein a layer comprised of refractory metal or refractory metal alloy is on said at least one layer comprised of nickel.

4. The article of claim 1 wherein a layer comprised of refractory metal oxide or refractory metal alloy oxide is on said layer having the appearance of stainless steel.

5. The article of claim 3 wherein a layer comprised of refractory metal oxide or refractory metal alloy oxide is on said layer having the appearance of stainless steel.

6. The article of claim 1 wherein a layer comprised of chromium is on said at least one layer comprised of nickel.

7. The article of claim 6 wherein a strike layer comprised of refractory metal or refractory metal alloy is on said layer comprised of chromium.

8. The article of claim 7 wherein said stack layer is on said strike layer.

9. The article of claim 1 wherein a layer comprised of tin and nickel alloy is on said at least one layer comprised of nickel.

10. The article of claim 9 wherein a strike layer comprised of refractory metal or refractory metal alloy is on said layer comprised of tin and nickel alloy.

11. The article of claim 10 wherein said stack layer is on said strike layer.

12. The article of claim 1 wherein said at least one layer comprised of nickel is comprised of one nickel layer.

13. The article of claim 1 wherein said at least one layer comprised of nickel is comprised of two layers of nickel.

14. The article of claim 1 wherein said coating has the appearance of brushed stainless steel.

15. The article of claim 1 wherein said refractory metal is selected from the group consisting of zirconium, titanium and hafnium.

* * * * *